United States Patent [19]

Margala et al.

[11] 3,909,743

[45] Sept. 30, 1975

[54] FREQUENCY SYNTHESIZER WITH PSEUDO-REFERENCE PHASE COMPARATOR

[75] Inventors: Jean Pierre Margala; Jean Louis Roger Cassany, both of Paris, France

[73] Assignee: International Standard Electric Corporation, New York, N.Y.

[22] Filed: Feb. 25, 1974

[21] Appl. No.: 445,603

[52] U.S. Cl. .................... 331/11; 307/271; 331/25; 331/28

[51] Int. Cl.$^2$.......................................... H03B 3/04

[58] Field of Search .................. 331/10, 11, 28, 25; 307/271

[56] References Cited

UNITED STATES PATENTS 3,815,042 6/1974 Maunsell et al. .................... 331/11

FOREIGN PATENTS OR APPLICATIONS 1,024,427 3/1966 United Kingdom.................. 331/11

*Primary Examiner*—John Kominski
*Attorney, Agent, or Firm*—William T. O'Neil

[57] ABSTRACT

A frequency synthesizer having two feedback control loops, one employing a frequency comparator and the other including a sampling phase comparator. The device is useful in high frequency synthesis of a frequency program such as provided by a digitally programmable frequency divider.

5 Claims, 3 Drawing Figures

FREQUENCY SYNTHESIZER WITH PSEUDO-REFERENCE PHASE COMPARATOR

BACKGROUND OF THE INVENTION

1. Field of the Invention

The present invention relates to a frequency synthesizer using a sampling phase comparator.

2. Description of the Prior Art

A known synthesizer of the type with which this invention is concerned is basically an apparatus for generation of one of the lines of a discontinuous spectrum of predetermined stable frequencies which are multiples of a reference frequency $f_B$.

In the so-called "direct division" synthesizer, the spectrum is produced from a voltage controlled oscillator having a frequency $F_A$, controlled by a voltage and divided by N in a variable ratio divider. The signal of frequency $$f_A = \frac{F_A}{N}$$

to be analyzed has its frequency and phase compared to those of a signal at a reference frequency $f_B$ in two comparators which deliver output voltages to the VCO so as to control the oscillation frequency up to the value $F_o = Nf_B$; the first voltage corresponding to a presetting adjustment and the second one to a fine adjustment providing the synchronization.

In synthesizers, particularly those which are used in air traffic radionavigation systems, it is necessary that, after having set the division ratio N for producing an oscillation frequency $F_o = Nf_B$, the frequency comparator and the associated control loop, which provide the presetting, have a very short acquisition time so as to vary, as rapidly as possible, the voltage from its initial value, defining a frequency $F_A$, to the final value defining the desired frequency $F_o = Nf_B$.

In known art, usually the presetting voltage (i.e., corresponding to frequency $F_A$) does not vary during the acquisition period in a continuous manner but does vary step by step in a discontinuous manner so that the phase comparator must relieve the frequency comparator in order to correct the frequency differences between $F_A$ and $F_o$ which are less than the frequency step $\Delta F$ ($|F_A - F_0| \leq \Delta F$).

The digital presetting of a variable ratio divider, such as effected by elements 2 and 3 in combination, or the digital control of an oscillator frequency are known techniques obvious to those skilled in this art. For various reasons, it is not recommended to reduce $\Delta F$ too much. Indeed, the elementary acquisition time corresponding to the passage from division ratio N to ratio (N−1) or (N+1) is:

$$T_e = \frac{1}{f_B} \times \frac{F_o}{\Delta F} = \frac{N}{\Delta F}$$

Typically, if $N = 10^4$ and $\Delta F = 100$ kHz, the acquisition time $T_e$ is 100 ms, and with $\Delta F = f_B = 5$ kHz, $T_e$ has a value $(T_e)_{max} = 2$ s.

Such acquisition times are considered too long in certain modern equipments, designed for air traffic radionavigation system.

The following analysis shows the difficulties occurring in present phase comparator designs when $\Delta F$ is large. The larger $\Delta F$ is, the greater must be the variation range of the control voltage $V_e$ of VCO, $V_e$ being delivered by the phase comparator.

Voltage $V_e$ varies the tuning capacitor of the VCO oscillating at frequency $F_A$. AVCO conversion slope $$G_o = \frac{2\pi dF_A}{dV_e}$$

may be defined which is expressed in radian frequency/volts or in radians/second/volt. Assuming the phenomena to be linear, $G_o$ is:

$$G_o = \frac{2\pi \Delta F}{(V_e)_M},$$

$(V_e)_M$ being the maximum value of $V_e$.

Neglecting certain secondary components of the control loop, the phase comparator has a conversion slope $$G_1 = \frac{dV_e}{d\phi}$$

expressed in volts/radian, where $\phi$ is the phase deviation between pulses at frequency $f_B$ and $f_A$, both being applied to the comparator. If the phenomena are linear, it is possible to write:

$$G_1 = \frac{(V_e)_M}{2\pi}$$

The open-loop transfer function $H_o$ of the control system; comprising, in a simplified design, the variable ratio divider VRD, the phase comparator and the control input of the VCO; may be expressed in symbolic language, using the variable $p$ of the Laplace transform:

$$H_o = \frac{G_o G_1}{Np}$$

$$\text{(i.e., } H_r = \frac{\Delta F}{N}$$

when phenomena are linear).

In closed loop, transfer transform $H_1$ is written:

$$H_1 = \frac{H_o}{1 + H_o} = \frac{\frac{G_o G_1}{N}}{p + \frac{G_o G_1}{N}}$$

Considering the relation of $H_1$, it is possible to say that any random variation $\Delta F_A$ of frequency $F_A$ apart its balance value $Nf_B$ is compressed by the control system down to a value $(F_A)$, according to a law:

$$(\Delta F_A)' = \Delta F_A \, e^{-\frac{G_o G_1}{N} t}$$

Thus the greatest is ($G_o\,G_1/N$), and the corresponding compression is most rapid and the control system is most efficient.

In general, it is known that, in a control system the open-loop gain must be as high as possible so as to obtain good stability of the controlled magnitude and to reduce noise. In the present case, when the loop gain i.e., ($G_o\,G_1/N$) is relatively high, the signal from the VCO is constituted by a very narrow line at frequency $Nf_B$ without random frequency modulation.

Practically, $G_1$ does not vary as a linear function of $V_e$ and increases much less rapidly than $V_e$. Otherwise stated, the open-loop gain is substantially reduced when $V_e$ increases and becomes insufficient for providing good stabilization of the $F_A$ frequency. This occurs when $V_e$ reaches the value $(V_e)_M$. That situation develops in known sampling phase comparators which operate as follows.

A reference signal at frequency $f_B$ synchronizes a generator delivering (ideally) a saw-tooth voltage, that generator including a DC source charging a capacitor of capacitance C. The signal at frequency $f_A$ from the VRD opens $$(\text{at a rate } \frac{1}{f_A})$$

a memory wherein the voltage $V_e$ is stored across the capacitor.

If the voltage generator is actually a saw-tooth generator, the instantaneous voltage $E_S$ is proportional to time and thus to phase shift $\phi$. But any actual source has an internal resistance of finite value $\rho$ and the variation law for $E_S$ is not truly linear as a function of time $t$ or phase shift $\phi$. In fact, it is of the form of $E_o$ $$(1-e^{-\frac{t}{\tau}}),$$

$E_o$ being the voltage of the DC source and $\tau$ being the time constant $\rho$ C.

The conversion slope $G_1$ is written:

$$G_1 = \frac{dE_S}{d\phi} = \frac{dE_S}{dt} \cdot \frac{dt}{d\phi}$$

As time $1/f_B$ corresponds to a phase shift of $2\pi$:

$$\frac{dt}{d\phi} = \frac{1}{2\pi f_B}, \text{ and } G_1 = \frac{E_o}{2\pi f_B \tau} e^{-\frac{\phi}{2\pi f_B \tau}}$$

$G_1$, which is at a maximum of $$(G_1)_{max} = \frac{E_o}{2\pi f_B \tau},$$

for $\phi = 0$, reaches the minimum value.

$$(G_1)_{min} = \frac{E_o}{2\pi f_B \tau} e^{-\frac{1}{f_B \tau}}, \text{ for } E_o\,(1-e^{-\frac{1}{f_B \tau}}) = (E_S)_M.$$

$G_1$ may be still written as $$G_1 = \frac{E_o}{2\pi f_B \tau}\,(1-\frac{E_S}{E_o})$$

if ($E_S/E_o$) is small enough compared to unity, the phenomena stay linear, but that is no longer true if ($E_S/E_o$) approaches unity. $G_1$ decreases to 0 in that case.

To overcome that drawback, in known techniques, $E_o$ has been considerably increased so as to satisfy the condition $$\frac{(E_S)_M}{E_o} << 1.$$

Such an increase of the source emf is not acceptable in many equipments. Up to now it has been assumed that the DC source has a constant value $E_o$. It may be also assumed that that source delivers a constant current $I_o$. Then the charge law of the capacitor of capacitance C is linear as a function of time and of phase shift, and $$G_1 = \frac{I_o}{C}\;\frac{1}{2\pi f_B}.$$

The voltage $$(E_S)_M \text{ is } \frac{I_o}{Cf_B}.$$

That voltage $(E_S)_M$ must necessarily be less than the source $E_o$ which generates current $I_o$, otherwise $E_S$ increases up to $E_o$ and saturation occurs. The same difficulty as previously mentioned then recurs and $E_o$ would have to be considerably increased. The manner in which the present invention deals with and improves upon the prior art will be evident as this description proceeds.

SUMMARY OF THE INVENTION

A purpose of this invention is to provide a sampling phase comparator having a rather constant conversion slope value $G_1$, such a value being close to the maximum value while maintaining the DC source at the same value $E_o$ that it would have if the phenomena were linear.

In accordance with already adopted notations, $E_o=(2\pi f_B\tau)$ ($G_1$) results.

According to a feature of this invention, $m$ pulses at frequency $m\ f_B$ (constituting a pseudo-reference-signal) correspond to a pulse at reference frequency $f_B$, those pseudo-reference pulses replacing the single pulse used in the usual prior art sampling phase comparator.

After each pulse at frequency $m\ f_B$, capacitor C is charged during a time ($1/f_B$) and the conversion slope $G_1$ varies from $$G_1 = \frac{E_o}{2\pi f_B \tau}, \text{ to } \frac{E_o}{2\pi f_B \tau} e^{-\frac{1}{m f_B \tau}}$$

If $m$ is great enough, $e^{-1/m f_B \tau}$ stays very close to 1 and $G_1$ remains relatively constant.

The maximum voltage across C is $$(E_S)_M = \frac{E_o}{m f_B \tau}.$$

With a DC current source, the voltage across C varies linearly during a time $(1/m\ f_B)$ and reaches the value $$(E_S)_M = \frac{I_o}{m C f_B \tau}.$$

Therefore the source emf may be maintained at a value that is $m$ times smaller than that which is necessary when the device according to this invention is not utilized.

Accordingly, the single saw-tooth corresponding to a maximum voltage from phase comparator output equal to $(I_o/Cf_B)$ is replaced by a sequence of m similar saw-teeth having the same slope as the single saw-tooth and each corresponding to a maximum voltage $(I_o/mCf_B)$.

The utilization of the device according to the invention has an additional advantage, namely that the output voltage $(E_S)_M$ from the phase comparator, which is applied to the VCO is m times smaller than that which is applied in usual phase comparator.

In prior art, the oscillation frequency adjustment for the VCO is effected by varying the capacitance of a varactor under the influence of $E_S$. The voltage, which may be accepted by a varactor is limited and in usual cases voltage $(E_S)_M$ must be reduced by any suitable means before being applied to the varactor. On the contrary, with the device according to this invention, a suitable selection of m permits a voltage $(E_S)_M$ small enough to eliminate the need for any voltage reducer.

In prior art devices, saw-tooth voltages across the capacitor C occur at frequency $f_B$, the passage from one saw-tooth to the next one being achieved by short-circuiting the capacitor of capacity C. That short-circuit condition duration must be very short compared to $(1/f_B)$.

In the device according to this invention, on the other hand, the saw-tooth voltages occur at frequency $mf_B$ and, during a sampling period $(1/f_B)$, the capacitor C is short-circuited m times. The duration of each of those short-circuit conditions is substantially shorter than that which is tolerable in prior art devices. Indeed, it is necessary to reduce to a minimum the dead times of phase scanning.

In other words, pulses at frequency $mf_B$ must be very short.

Those pulses are delivered from a sharper circuit.

In known art, pulses at frequency $f_B$ are produced by digitally dividing the highly stabilized frequency $F_B$ of a rectangular signal source $(F_B = Mf_B)$ by M.

According to another feature of this invention, the digital divider comprises two outputs, a division-by-M output delivering those pulses at frequency $f_B$ which will be used in a synthesizer frequency comparator and a division-by-(M/m) output delivering pulses at frequency $mf_B$ which must be processed in a shaper.

According to another feature of this invention, the shaper consists in a flip-flop provided with a priority reset input receiving rectangular singles at frequency $F_B$, and a pulse input receiving pulses at frequency $mf_B$ $$\left(\text{or } \frac{mF_B}{M}\right).$$

Due to this arrangement pulses at frequency $mf_B$ have, at the flip-flop output, a width less than or equal to $(1/2F_B)$.

In the device described, the frequency comparison function in 5 is operative as long as $|F_A - Nf_B| \geqslant \Delta F$, whereas control by phase comparison in 10 is active as soon as $|F_A - Nf_B| \leqslant \Delta F$.

Other features of this invention will appear more clearly from the following detailed description of an embodiment, the said description being made in conjunction with the accompanying drawings.

DESCRIPTION OF THE PREFERRED EMBODIMENT

Figures 1, 2, 3:
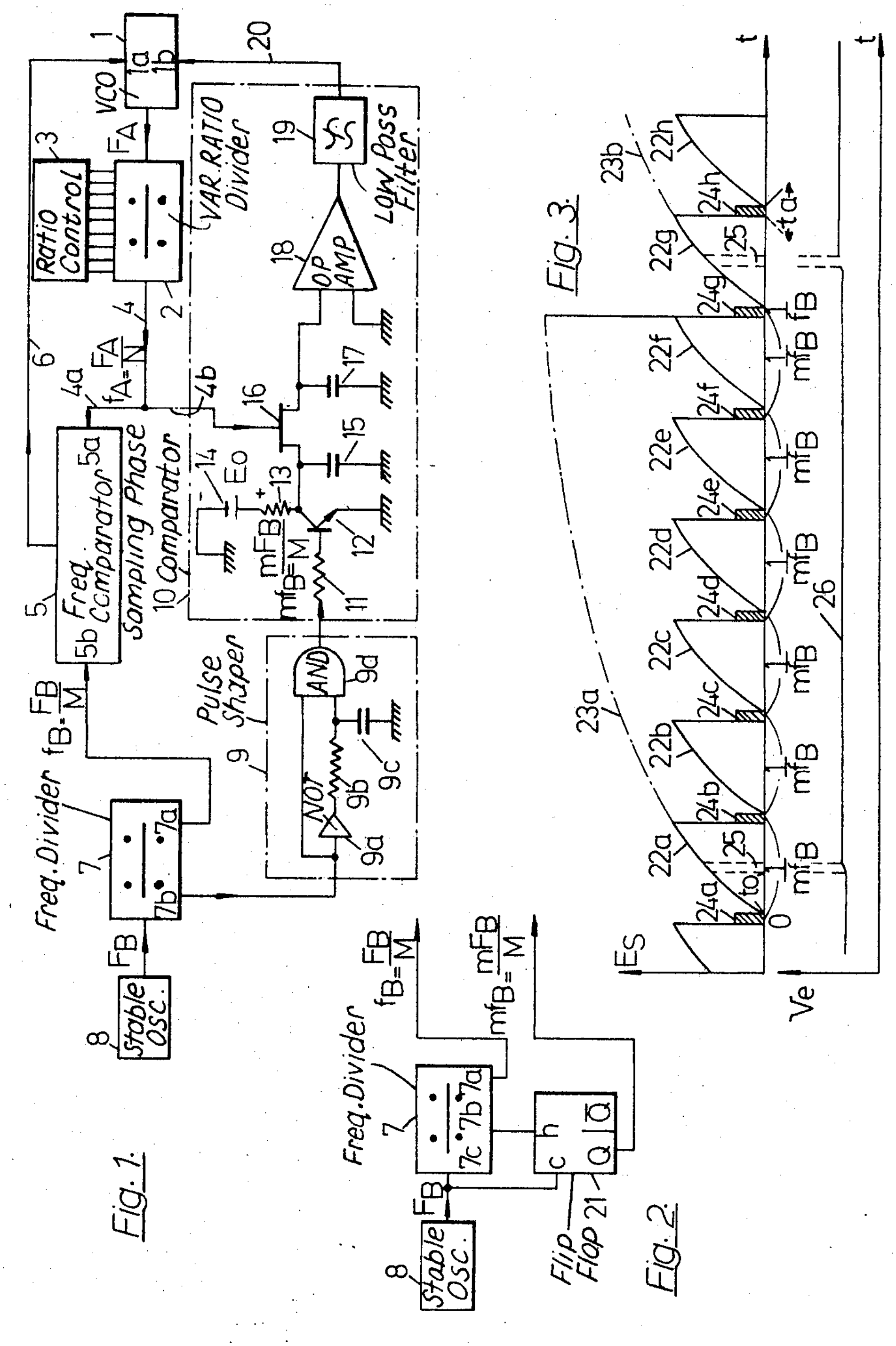
FIG. 1 is a circuit diagram of a digital frequency synthesizer utilizing a sampling phase comparator according to the invention.
FIG. 2 shows details of a pulse shaper according to the invention.
FIG. 3 shows a set of waveforms for explaining the operation of the sampling phase comparator shown in FIG. 1.

Referring now to FIG. 1, a description of the structure and function of a device for practicing the invention will be described.

VCO oscillator 1 has a frequency $F_A$ which is controlled by one or several voltages which are, for example, applied to varactors included in the tuning capacitor of the oscillating circuit.

Signals at frequency $F_A$, are sent from 1 to a variable ratio frequency divider 2 having a division ratio 1/N determined from a control unit 3.

Pulses, at frequency $$\frac{F_A}{N} = f_A,$$

are transmitted from 2, via lines 4 and 4*a*, to input 5*a* of frequency comparator 5, whose other input 5*b* receives pulses at reference frequency $f_B$. From the output of 5, an error voltage appears which is proportional to $|f_A - f_B|$ and which is, via lead 6, applied to one of the control input 1*a* of VCO 1.

Frequency comparator 5 may be, for example, of the type described in U.S. Pat. No. 3,824,483.

That frequency comparator provides a presetting which leads to a frequency difference $|F_A - F_B|$ less than or equal to $\Delta F$.

Pulses, at reference frequency $f_B$, are delivered from output 7*a* of frequency divider 7, whose input receives signals at frequency $F_B$ delivered by highly stabilized oscillator 8. Output *7a* corresponds to a division ratio of $$\frac{1}{M}(f_B = \frac{F_B}{M}).$$

Divider 7 also has an output *7b* which corresponds to a division ratio (m/M). Output *7b* is connected to the input of pulse shaper 9.

Shaper 9 comprises components and connections as follows:

One input of a two-input AND gate **9*d*** receives signals from output *7b* of 7.

Output *7b* is also connected to a NOT gate **9*a* whose output is, via a delay circuit comprising resistor 9*b* and capacitor 9*c*, connected to the second input of 9*d***. Each time a logic level "1" appears from output *7b*, the two inputs of **9*d* are in condition "1", and 9*d* is turned on and is only turned off after a time duration which is roughly determined by the time constant of 9*c* and 9*b***.

Thus, pulses at the pseudo-reference frequency $$mf_B = \frac{mF_B}{M}$$

are delivered from output of 9 with the desired width.

Block 10 comprises a sampling phase comparator according to this invention.

The output of 9 is connected, through a protection resistor 11, to the base of a transistor 12 having its collector supplied, via resistor 13 of value $\rho$, by a DC source 14 having emf $E_o$. The internal resistance of 14 is considered as a part of 13.

The emitter of 12 is connected to ground and capacitor 15, having a capacitance C, is connected from collector to ground.

The collector of 12 is connected to a field-effect transistor 16 phase whose drain is connected to one of the electrodes of capacitor 17, called the "memory-capacitor". The gate of 16 is connected, via line 4–**4*b*, from the output of variable ratio divider 2** and thus receives pulses at analysis frequency $$f_A = \frac{F_A}{N}.$$

The voltage across 17 is amplified in an operational amplifier 18 having a very high input impedance and very small output impedance. Amplifier 18 is followed by a low-pass filter 19 whose output is, via line 20, connected to one of the control inputs **1*b* of VCO 1. The function of 19 consists in eliminating components, at frequencies $f_A$ and $mf_B$, from the error voltage delivered by 18**.

Operation of circuits shown in FIG. 1

It is to be noted that transistors 12 and 16 operate as impedance switches. Considering transistor 12 for example, its emitter-collector space has a very low impedance when a pseudo-reference pulse is applied to its base, and a very high impedance between such pulses.

Thus capacitor 15 is discharged during application of a pseudo-reference pulse to the base of 12.

The source-drain space of 16 has a very high impedance when no analysis pulse is applied to its gate, and a very low impedance when an analysis pulse is applied thereto. Thus, typically, a voltage appears across capacitor 7 which stays substantially constant between two successive analysis pulses.

During the very short duration of an analysis pulse, the voltage across 17 has the instantaneous value of the voltage across capacitor 15. The operation of the assembly shown in FIG. 1 is then as follows:

It is assumed that VCO 1 is operating at a frequency $(F_A)_o = N_o f_B$, the division ratio 1/N being set by means of ratio control unit 3 and variable ratio divider 2. Frequency comparator 5 is rendered operative and the error voltage is, via line 6, applied to input **1*a* of VCO 1** and thus changes the oscillation frequency by steps each equal to ΔF up to $/ F_A - Nf_B / \leq \Delta F$.

As long as that condition is extant, frequency comparator 5 remains inoperative and phase comparator 10 operates alone for slaving frequency $F_A$ to frequency $Nf_B$.

The waveforms shown in FIG. 3, which illustrate variations of voltages $E_S$ across capacitor 15 and $V_e$ across memory capacitor 17, versus time, make it possible to understand the operation of phase comparator 10.

Pulses, at pseduo-reference frequency $mf_B$, are illustrated by hatched rectangles **24*a*, . . . , 24*g***, 24*h*. For a better understanding of the drawing, the width of those pulses has been exaggerated.

When **24*a* is, for example, applied to the base of transistor 12, capacitor 15 is rapidly discharged. Then, it is recharged to the time of the next pulse 24*b*** applied thereto.

The curve **22*a*, which illustrates the charge variation of 15** according to the relation:

$$E_S = E_o\,(1 - e^{-\frac{t}{\tau}})\ \text{with}\ 0 < t < \frac{1}{mf_B}$$

The other curves **22*b*–22*h* are similar to 22*a***.

The curve **23*a* would illustrate the charge curve of 15 if pulses at frequency $f_B$ were applied to the base of 12** instead of pulses of frequency $mf_B$.

Pulses at analysis frequency $f_A$, which are applied to the gate of transistor 16, are illustrated by dotted rectangles **25*a* and 25*b***.

The voltage, which is stored in 17, is the same as across capacitor 15 when the analysis pulse occurs.

Voltage $V_e$ across 17 varies as indicated by the lower curve shown in FIG. 3. Between two successive storages, that voltage naturally decreases slightly, however, that is not disturbing because, when $f_A$ and $f_B$ are synchronized (i.e., if $f_A$ is rigorously equal to $f_B$) the curve illustrating the variation of $V_e$ versus time involves a DC component, which is proportional to a fixed phase difference between reference pulses and analysis pulses, and also components at frequency $f_B$ and harmonic frequencies thereof. The latter are eliminated by filter 19.

Before synchronization is achieved, there is a difference ΔF between $f_A$ and $f_B$, $\Delta f$ having the maximum value (ΔF/N). For simplification, it is assumed that $f_A = (f_B + \Delta f)$ and that $(1/mf_B\tau)$ is small enough to permit $$e^{-\frac{1}{mf_B\tau}} = 1 - \frac{1}{mf_B\tau}$$

to be written.

If the loop is opened, that is if line 20 from filter 19 to the input 1*b* of VCO 1 (FIG. 1) is interrupted, those voltages $V_e$, which are stored in 17, have the following successive values:

$$(V_e)_o = E_o \frac{t_o}{\tau},$$

$t_o$ being the occurrence time for 25*a*, $$(V_e)_1 = E_o \frac{t_o - \frac{\Delta f}{f_B 2}}{\tau},$$

when 25*b* occurs, and so on up to $$(V_e)_n = E_o \frac{t_o - \frac{n\Delta f}{f_B 2}}{\tau}.$$

Thus $V_e$ may be regarded as a signal at frequency $f_B$ phase modulated at frequency $\Delta f$. The phase of $V_e$ is written: $2\pi \Delta f t + \phi_o$.

If the loop is closed, voltage $(V_e)_1$, applied to input 1*b* of VCO 1 (FIG. 1), causes $F_A$ to decrease as well as $f_a$ and, consequently, $\Delta f = f_a - f_b$ is also decreasing.

After a sequence of analysis pulses, $\Delta f$ tends to become zero and only a constant phase difference corresponding to a continuous quasifixed voltage $V_e$ is still existing as shown in the lower portion of FIG. 3.

It is to be noted that, before synchronization has been reached, voltage $V_e$ varies according to a law as a function of time, first with a frequency $\Delta f$, then with more and more low frequencies. The maximum frequency is equal to $(\Delta F/N_{min})$, $\Delta F$ being the frequency comparator step and $1/N_{min}$ being the lowest division ratio used in this synthesizer. Thus, filter 19, as shown in FIG. 1, has to pass that frequency which defines its cutoff frequency limit.

It is still to be noted that dividing the time interval $(1/f_B)$ into $m$ equal intervals $(1/mf_B)$ has no effect on the frequency of the phenomena as far as capacitor 17 and the following components are concerned.

Therefore, the open loop gain may be kept at a very high quasiconstant value, for any value of voltage $V_e$ across 17, after synchronization has been reached.

Pulse shaper of FIG. 2

The width $t_a$ of pulses 24*a*, 24*b*, 24*c* . . . 24*g*, 24*h*, as shown in FIG. 3, is basically determined by the characteristics of the shaper 9 shown in FIG. 1. As soon as one of those pulses (for example 24*a*) is applied to the base of transistor 12, capacitor 15 is discharged through the relatively low resistance of its emitter-collector path, within a time $t_b$. It is important that $t_a$ be substantially longer than $t_b$, otherwise curve 22*a* does not originate from initial voltage $E_S = 0$, but from some voltage depending on difference $t_b - t_a$. Shaper 9, as shown in FIG. 1, may advantageously be replaced by the circuit of FIG. 2.

In FIG. 2, stable oscillator 8 (actually a square wave generator) produces rectangular signals at a highly stabilized frequency $F_B$, and divider 7 provides $f_B$ from an output 7*a*, and from another output 7*c* pulses at division ratio 1/v are available.

Output 7*b* is connected to pulse input *h* of flip-flop 21, and reset input *c* of 21 is connected from the output of stable oscillator 8.

It is assumed that flip-flop 21 changes its condition when the level at input *h* changes from "1"to "0".

Such a condition change is then produced at times spaced by (M/m) $(1/F_B)$, since output 7*b* of 7 corresponds to a division ratio m/M.

Each occurrence of a pulse trailing edge from output 7*b* is substantially synchronized with a pulse leading edge of signals at frequency $F_B$ applied to input *c* of 21. When *c* is turned to level "1", the flip-flop condition change occurs and output Q of 21 is at level "1" until input *c* is turned to level "0" again.

Thus output Q generates pulses at frequency $$\frac{mF_B}{M} = mf_B,$$

with a width a little less than $1/2F_B$.

If that width is too short, the input *c* of 21 may be, in certain cases, taken from 7*c*. As a consequence, pulses from output Q have the same frequency as previously, but a width $(v/2F_B)$.

While the principles of the present invention have been hereabove described in relation with a specific embodiment, it will be clearly understood that the said description has only been made by way of example and is not intended to limit the scope of the invention.

What is claimed is:

1. A frequency synthesizer comprising:

a controllable frequency oscillator having an output $F_A$;

a divider by N responsive to said $F_A$ to produce a signal $$f_A = \frac{FA}{N},$$

as analysis pulses;

a stable source of reference pulses $F_B$ and divider means responsive thereto to divide said $F_B$ by M to produce $$f_B = \frac{FB}{M},$$

said means also producing shaped pulses $$mf_B = \frac{m}{M} F_B,$$

a pseudo-reference signal, where m is an integer representing a predetermined phase sampling frequency multiplier;

a frequency comparator connected to compare said analysis pulses $f_A$ and said pseudo-reference pulses $f_B$ to produce a first error signal as a function of $|f_B$ $-f_A|$ and for applying said first error signal to said controllable oscillator to modify said frequency $F_A$ up to a point at which $|F_A - Nf_B| \leqslant \Delta F$, said $\Delta f$ being a predetermined frequency error signal;

and a sampling phase comparator connected to compare said shaped pseudo-reference pulse signals and said analysis pulses to produce a second error signal as a function of the phase difference of said $f_B$ and $f_A$ pulses, said error signal being also applied to said controllable oscillator in a sense tending to reduce said second error signal to zero.

2. Apparatus according to claim 1 in which said sampling phase comparator comprises a saw-tooth generator including a resistor of value $\rho$, a serially connected capacitor of value C, a DC source applied across said serially connected resistor and capacitor, and a switching element controlled by said pulses $mf_B$, to substantially short-circuit said capacitor once each $1/mf_B$ period to generate a recurring saw-tooth wave of amplitude $E_o/mf_B\rho$ c comprising the signal actually compared with said $f_A$ signal in said sampling phase comparator.

3. Apparatus defined in claim 2, further defined in that the individual saw-tooth waves of said recurring saw-tooth wave are spaced by an interval $t_a$, and pulse shaping means connected to drive said switching element are provided, said pulse shaping means providing pulses of duration $t_a$ spaced by said $1/mf_B$ period, said $t_a$ being longer than the discharge time of said capacitor through said switching element.

4. Apparatus according to claim 1 including circuit means responsive to said $F_B$ pulse signal for producing said $f_B$ and $mf_B$ pulses synchronous said $F_B$ pulses.

5. Apparatus according to claim 4 in which said circuit means responsive to said $F_B$ signal comprises a flip-flop having triggering and reset inputs and a frequency divider circuit, said triggering input being connected from said divider output delivering pulses at $mF_B/M$ and said reset input being connected from an output of said divider delivering pulses at a division ratio V, said flip-flop generating said pseudo-reference pulses at frequency $mf_B$ and of duration $$t_a = \frac{V}{2F_B}.$$

* * * * *